(12) United States Patent
Bhatt et al.

(10) Patent No.: US 7,384,801 B2
(45) Date of Patent: Jun. 10, 2008

(54) INTEGRATED CIRCUIT WITH INDUCTOR HAVING HORIZONTAL MAGNETIC FLUX LINES

(75) Inventors: Hemanshu D. Bhatt, Vancouver, WA (US); Jan Fure, Portland, OR (US); Derryl D. J. Allman, Camas, WA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/811,519

(22) Filed: Jun. 11, 2007

(65) Prior Publication Data

US 2007/0254448 A1 Nov. 1, 2007

Related U.S. Application Data

(62) Division of application No. 10/614,307, filed on Jul. 2, 2003, now Pat. No. 7,253,497.

(51) Int. Cl.
*H01L 21/00* (2006.01)
(52) U.S. Cl. ............................ 438/3; 438/381; 438/622
(58) Field of Classification Search ................. 438/3, 438/381, 622
See application file for complete search history.

(56) References Cited

U.S. PATENT DOCUMENTS 5,793,272 A 8/1998 Burghartz et al.

6,291,872 B1 9/2001 Wang et al.
6,925,701 B2 8/2005 Eckstein et al.
7,253,497 B2 * 8/2007 Bhatt et al. .................. 257/531

OTHER PUBLICATIONS

Marc T. Thompson, Inductance Calculation Techniques—Part II: Approximations and Handbook Methods, "Power Control and Intelligent Motion," Dec. 1999, website http://www.pcim.com, http://members.aol.com/Marcttpapers2/Induct2.pdf.
Steve Moshier, Calculation of electrical inductance—COIL02 Electrical Inductance Calculator, Jan. 2002, http://www.moshier.net/coildoc.html.

* cited by examiner

*Primary Examiner*—Mark Prenty
(74) *Attorney, Agent, or Firm*—L. Jon Lindsay (57) ABSTRACT

An integrated circuit (IC) includes one or more inductors that have magnetic flux lines substantially parallel to a generally horizontal plane of the IC. The inductor is formed in a plurality of conductor layers separated by insulating layers of the IC. Regions of highest magnetic flux density of the inductor may preferably be located near the edge of the IC. Additionally, the inductor may preferably be segmented. The over-all inductance may preferably be controlled by turning on and off selected inductors or inductor segments.

8 Claims, 6 Drawing Sheets

INTEGRATED CIRCUIT WITH INDUCTOR HAVING HORIZONTAL MAGNETIC FLUX LINES

CROSS-REFERENCE TO RELATED APPLICATION

This application is a Divisional Application of U.S. patent application Ser. No. 10/614,307, filed Jul. 2, 2003 and now U.S. Pat. No. 7,253,497, by Hemanshu D. Bhatt, et al., and entitled "Integrated Circuit with Inductor Having Horizontal Magnetic Flux Lines."

FIELD OF THE INVENTION

This invention relates to semiconductor integrated circuits (ICs) having inductors formed therein. In particular, this invention relates to new and improved techniques for forming an inductor having horizontal, rather than vertical, magnetic flux lines within the IC.

BACKGROUND OF THE INVENTION

A significant trend throughout IC development has been to reduce the size of the components within the IC's. As the size is reduced, the performance requirements and design margins of the components become more stringent. One aspect of IC's that affects the performance requirements and design margins is the interference between two components within the IC due to magnetic field generation by one or both of the components during operation of the IC. For example, an inductor formed on an IC chip can generate a relatively strong time-dependent magnetic field, which can induce current in other parts, or circuitry, of the IC, thereby affecting the performance of the other parts of the IC. Additionally, inductive coupling between the inductor and other parts of the IC, such as the substrate of the IC, can reduce the quality of the inductor, thereby affecting the performance of the inductor.

Figure 1:
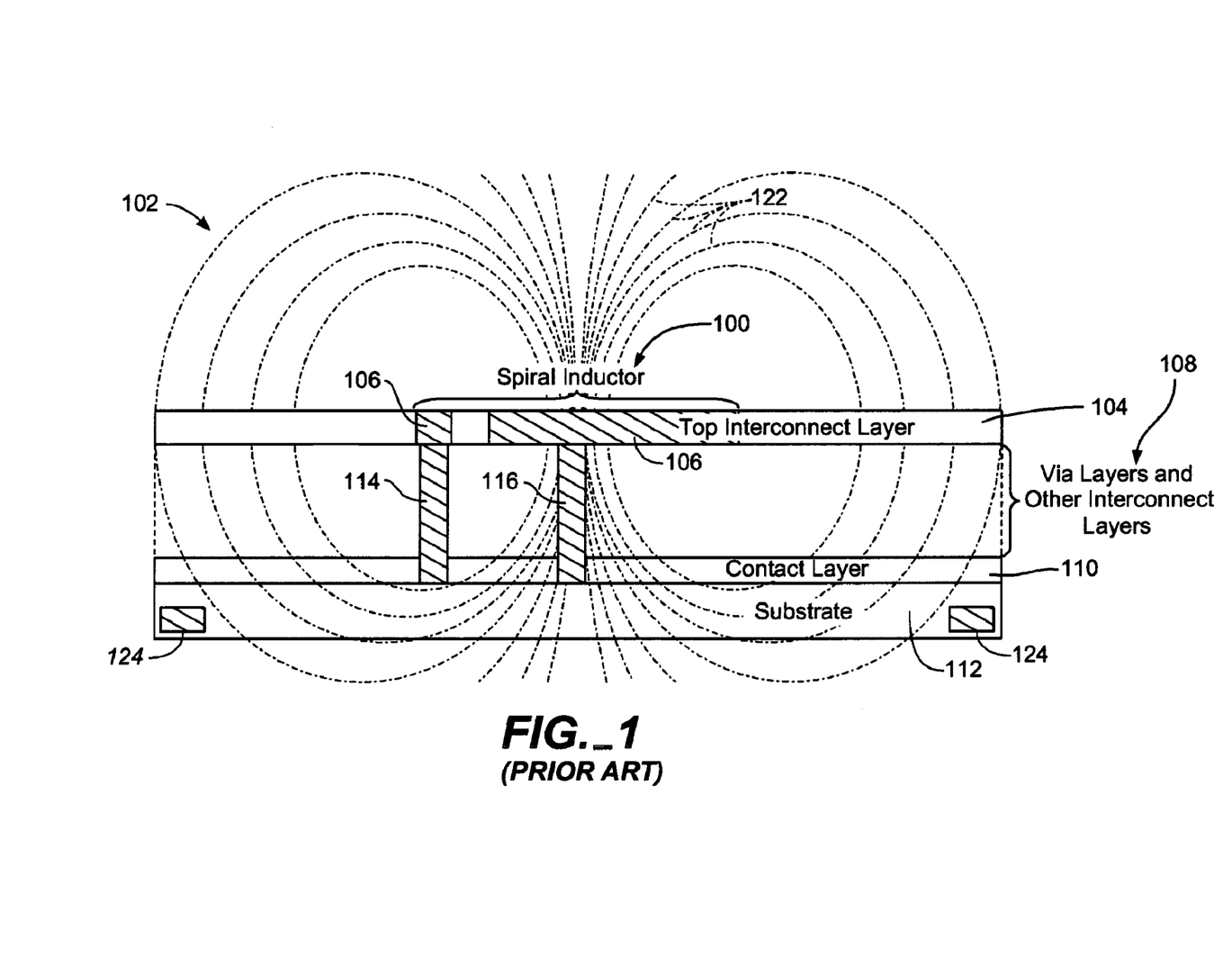
FIG. 1 is a simplified, broken, cross-sectional view of portions of a prior art integrated circuit that includes a prior art inductor.
Figure 2:
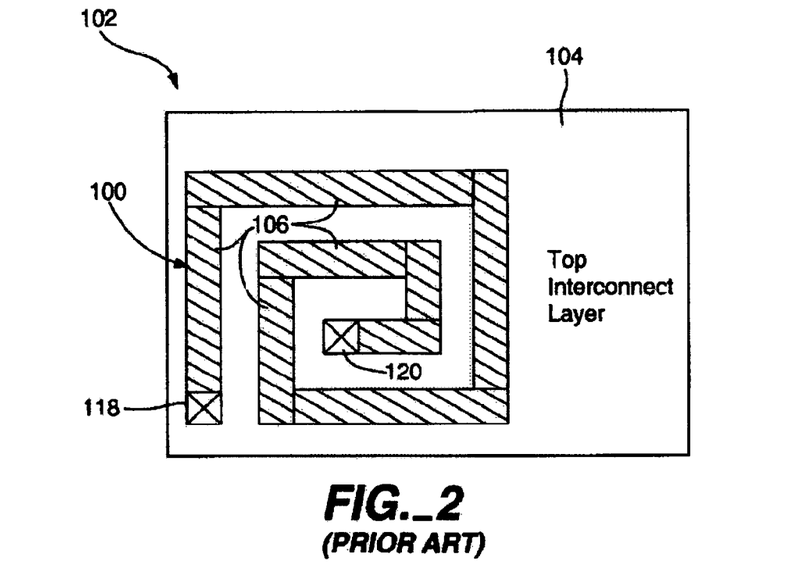
FIG. 2 is a simplified, broken, top view of the prior art integrated circuit, including the prior art inductor, shown in FIG. 1.

A typical on-chip inductor 100 formed on an IC 102 is shown in FIGS. 1 and 2. The inductor 100 is generally spiral-shaped, as seen in the top view in FIG. 2. Additionally, the inductor 100 is typically located in one interconnect layer (a.k.a. "metal layers" and "conductor layers") of the IC 102, such as the top interconnect layer 104. The inductor 100 is, thus, generally formed by latitudinal and longitudinal conductors 106 within the top interconnect layer 104. The IC 102 also generally includes via layers and other interconnect layers 108, a contact layer 110 and a substrate 112 (FIG. 1). The substrate 112 generally includes various structures and components, such as transistors, capacitors, etc. (not shown). The inductor 100 is typically connected through the via layers and other interconnect layers 108 and the contact layer 110 to the substrate 112 by conductors 114 and 116 (FIG. 1) that contact the inductor 100 at points 118 and 120 (FIG. 2).

Upon operation of the IC 102, a transverse magnetic field, represented by magnetic flux lines 122 (FIG. 1), is generated by the inductor 100. The magnetic flux lines 122 extend through the via layers and other interconnect layers 108, the contact layer 110 and the substrate 112. As the magnetic field varies, currents are induced in the substrate 112. Though the magnetic field is stronger nearer to the inductor 100, as indicated by the density of the magnetic flux lines 122, the magnetic field is still relatively strong down in the substrate 112. Thus, if the inductance of the inductor 100 is relatively high, the effect of the magnetic field on the substrate 112 may be significant.

There are several options for countering the effects of the magnetic field of the inductor 100 on the other components of the IC 102. One option is to include a ground plate (not shown) or a guard ring 124 (FIG. 1) in the IC 102 to effectively "absorb" some of the magnetic field, thereby reducing the intensity of the magnetic field in the substrate 112. The ground plate (typically polysilicon or metal) would typically be between the contact layer 110 and substrate 112 transversing the magnetic field area. The guard ring 124 is typically in the substrate 112 below the front end layers (not shown). The guard ring 124 is typically a highly doped grounded region that is deeper than a well region. This option, however, takes up valuable space within the IC 102 and increases the cost of the IC 102.

Another option is to locate the other components of the IC 102 in the substrate 112 at a sufficient distance from the inductor 100 that the magnetic field is too weak to have any significant effect on the performance of the other components. Thus, a region beneath the inductor 100 is free of any of the other components. This option, however, may waste valuable space in the IC 102 and require conductor lines between components to be undesirably long to reach between opposite sides of the inductor 100. In fact, in some applications, the inductors may take up a significant percentage of the area of the IC, resulting in significantly fewer IC's per wafer if the other components cannot be placed close to the inductors.

Another option is to allow for sufficient margins in the design of the other components of the IC 102. This option, however, results in a lower-performing IC.

Another option is to make the design of the inductor 100 more aggressive with lesser margins. This option, however, results in a more expensive IC.

Another option is to make the inductors larger to compensate for smaller quality factors. This option, however, may result in taking up a significant percentage of the IC's area with the inductors, increasing the size of the IC's and reducing the number of IC's per wafer.

It is with respect to these and other considerations that the present invention has evolved.

SUMMARY OF THE INVENTION

The present invention involves an IC and a method of making an IC having at least one inductor that avoids the disadvantages described above. The geometry of the inductor minimizes the negative effects of the magnetic field thereof. Thus, there is no need for a guard ring to attenuate the magnetic field of the inductor. Additionally, other components of the IC can be placed in close proximity to the inductor without having to alter the margins in the design of either the inductor or the other components to account for the magnetic field of the inductor.

The inductor is essentially horizontal on the IC, so the magnetic flux lines are generally parallel to an over-all plane of the IC. In this manner, the region of highest magnetic flux density of the inductor is not near the substrate of the IC. In some embodiments, the region of highest magnetic flux density is preferably at the edge of the IC, away from the other components of the IC. Thus, at least one end of the inductor is preferably located near the edge of the IC.

The inductor preferably has a horizontal coil shape formed within multiple interconnect layers of the IC, instead of a spiral shape formed in just one interconnect layer, as described in the background. Additionally, the inductor has a generally rectangular cross-section. Each coil of the inductor, thus, has horizontal and vertical legs. The horizontal legs are preferably formed in conductor lines in the interconnect layers of the IC. The vertical legs are preferably formed in conductive vias in the dielectric layers, or "via layers," between the interconnect layers as well as in the interconnect layers.

The inductor may preferably include several inductor segments connected in series to form a single long inductor. Additionally, adjacent segments may preferably have their coil-shape in different spiraling angular directions, but their magnetic flux fields in the same orientation. Furthermore, some of the segments may preferably be spaced apart sufficiently to allow conductors between the segments to electrically connect other components of the IC. The segments of the inductor may preferably be connected with switches that can turn on and/or off the inductor segments, so the over-all inductance of the inductor can be changed.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

DETAILED DESCRIPTION

Figure 3:
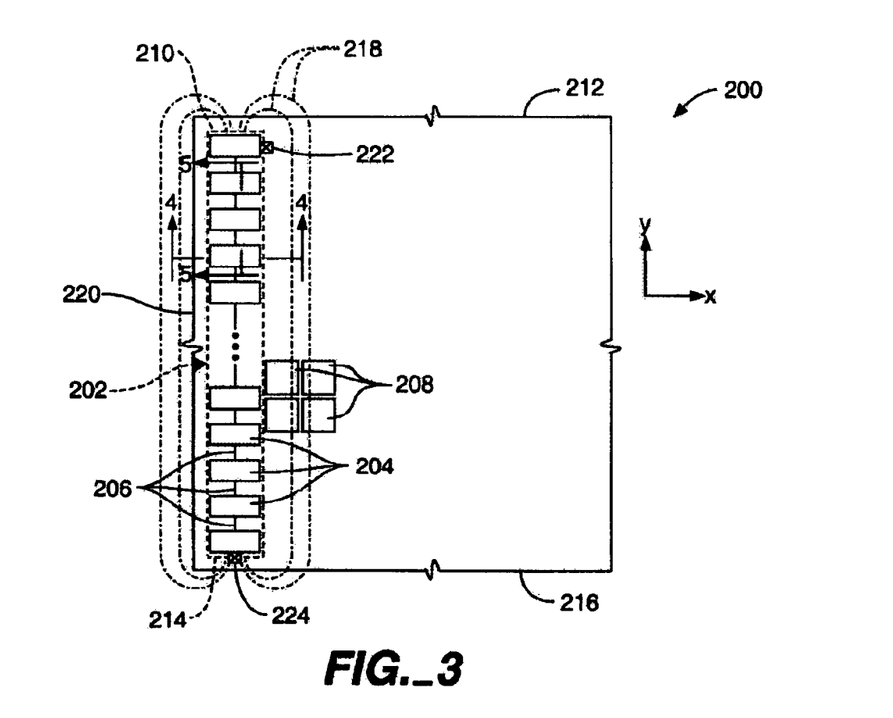
FIG. 3 is a simplified schematic of portions of an integrated circuit, including an inductor, in which the present invention is incorporated and which has been fabricated according to the present invention.

A portion of an integrated circuit (IC) 200, such as a mixed analog IC, which incorporates the present invention and which is formed by the methodology of the present invention is shown in FIG. 3. The IC 200 includes an inductor 202 formed by a plurality of inductor segments 204 connected by electrical conductors 206. Each segment 204 essentially forms one coil of the inductor 202, so the inductor 202 is effectively a coil-shaped inductor. The IC 200 also preferably includes a variety of other components 208, such as transistors, capacitors, resistors, etc. located throughout the IC 200, including adjacent (as shown) or under the inductor 202.

In a preferred embodiment, the inductor 202 is formed as shown with one end 210 located near an edge 212 of the IC 200 and an opposite end 214 of the inductor 202 located near an opposite edge 216 of the IC 200. In this configuration, a time-dependent magnetic field (indicated by magnetic flux lines 218) created by the inductor 202 upon operation of the IC 200 is generally parallel to an over-all x-y plane of the IC 200. The region of greatest magnetic flux density occurs at the ends 210 and 214 of the inductor 202 near the edges 212 and 216 of the IC 200. Thus, the other components 208 of the IC 200, even if adjacent to (as shown) or under the inductor 202, are not significantly affected by the magnetic field of the inductor 202.

Also, the inductor 202 is preferably formed as shown near another edge 220 of the IC 200. In this configuration, the magnetic flux lines 218 along the length of the inductor 202 extend off the edge 220 of the IC 200, so there are no other components of the IC 200 in this area with which the inductor 202 could potentially inductively couple, even if the magnetic field was strong enough to do so in a significant manner.

Additionally, the inductor 202 is preferably connected at connection points, or "taps," 222 and 224 to other parts of the IC 200, such as other components in a "front-end" layer, or substrate, (described below). The connection points 222 and 224 are preferably at the ends 210 and 214 of the inductor 202, or an inductor segment 204, and can extend a distance beyond the inductor 202 before making contact to the other parts of the IC 200.

Figure 4:
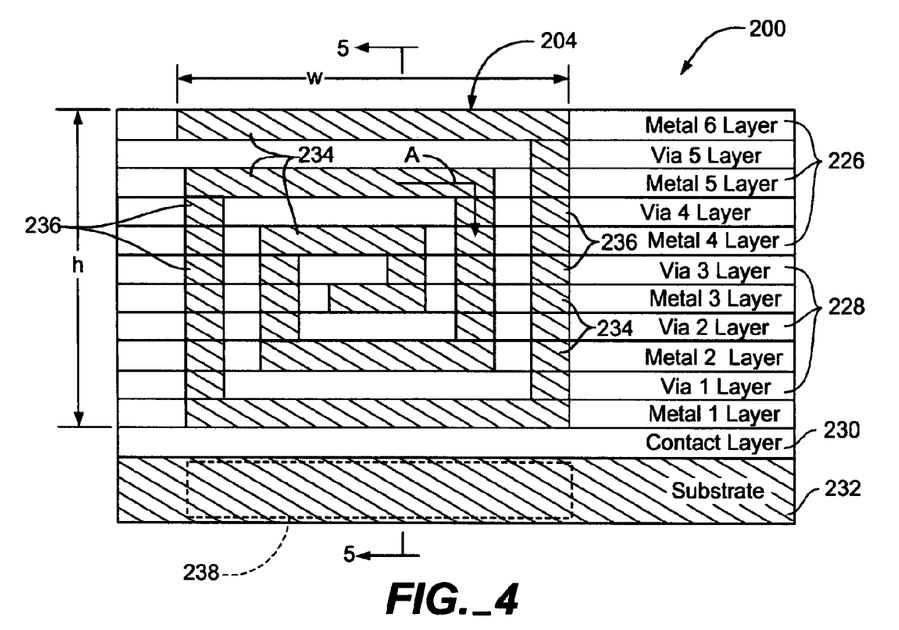
FIGS. 4, 5 and 6 are simplified, broken, cross-sectional views of portions of the integrated circuit shown in FIG. 3.
Figure 5:
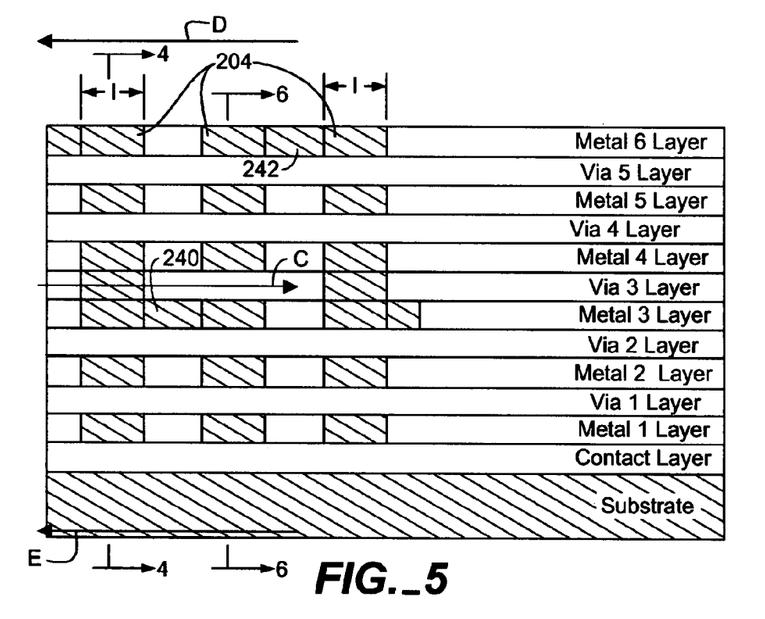

The IC 200 further includes interconnect layers 226 (a.k.a. metal layers and conductor layers), ILD (interlayer dielectric) layers 228 (a.k.a. via layers and insulator layers), a contact layer 230 and a substrate (a.k.a. front-end layers) 232, as shown in a cross-sectional view shown in FIG. 4 taken along section lines 4-4 in FIGS. 3 and 5. The substrate 232 generally includes various layers (not shown) that form the other components 208 (FIG. 1), such as the transistors, capacitors, resistors, etc. of the IC 200. The interconnect layers 226 generally include conductors 234 (e.g. metal lines) that electrically connect various portions of the IC 200. The ILD layers 228 separate, or insulate, the interconnect layers 226 and generally include vias 236 (e.g. metal plugs) that electrically connect the conductors 234 between different interconnect layers 226. The contact layer 230 generally separates the substrate 232 from the first interconnect layer 226. Combinations of the conductors 234 and the vias 236 within the interconnect layers 226 and the ILD layers 228, respectively, enable electrical connections between the various components of the IC 200. Optionally, a ground plane can be used to isolate the inductor from the components in the IC 200.

The inductor segments 204 are formed within the interconnect layers 226 and the ILD layers 228. The inductor segments 204 have a generally rectangular spiraling coil-shape, as shown in FIG. 4. The rectangular spiraling coil-shape generally includes horizontal and vertical legs. The horizontal legs are formed by the conductors 234 in the interconnect layers 226. The vertical legs are formed by the vias 236 in the ILD layers 228 and by the conductors 234 in the interconnect layers 226.

In a particular embodiment, the substrate 232 includes a region 238 that is directly beneath the inductor segments 204 and substantially free of the other components 208 (FIG. 3). Since many of the other components 208 are electrically connected to the conductors in the interconnect layers 226 directly above the other components 208, it may be impractical to place any of the other components 208 directly beneath the inductor 202 (FIG. 3), because the inductor segments 204 take up all of the interconnect layers 226 within a width (w) of the inductor segments 204.

In another particular embodiment, however, the inductor segments 204 do not take up all of the interconnect layers 226. Instead, at least one of the interconnect layers 226, such as the first interconnect layer 226 (metal 1 layer), is unused by the inductor segments 204. In this manner, the region 238 directly beneath the inductor segments 204 may include some of the other components 208 (FIG. 3) electrically connected to at least one of the interconnect layers 226, preferably between the inductor segments 204 and the region 238. In a further embodiment, the inductor 202 (FIG. 3) does not use any of the interconnect layers 226 used by the other components 208 (FIG. 3) of the IC 200 (FIG. 3). Instead, the inductor 202 is formed in additional layers 226 and 228 formed above the interconnect layers 226 used by the other components 208, so the region 238 below the inductor 202 may be fully used for the other components 208. Use of either of these embodiments may depend on space requirements of the particular application for which the IC 200 is designed. The time-dependent magnetic field of the inductor 202 does not significantly adversely affect the other components 208 in the region 238, since the density of the magnetic field is relatively low along the length of the inductor 202. Optionally, a ground plate (not shown) can be used to isolate the inductor 202 from the other components 208 in the IC 200.

Figure 6:
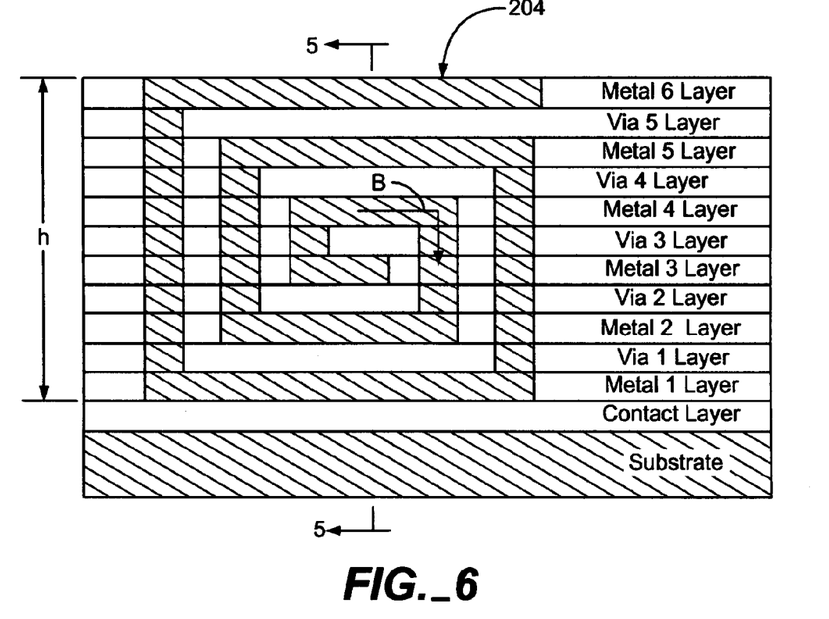

The inductor segments 204 are connected to each other through the interconnect layers 226, as shown in a cross-sectional view in FIG. 5 taken along section lines 5-5 in FIGS. 3, 4 and 6. In the embodiment shown, the left inductor segment 204 is connected to the middle inductor segment 204 by a conductor 240 only in the third interconnect layer 226 (metal 3 layer). The middle inductor segment 204 is connected to the right inductor segment 204 by a conductor 242 only in the sixth interconnect layer 226 (metal 6 layer).

Additionally, the cross-sections of the inductor segments 204 preferably alternate according to the examples shown in FIGS. 4 and 6. In other words, the cross-section of the left inductor segment 204 is illustrated by FIG. 4, described above. The cross-section of the middle inductor segment 204 is illustrated by the cross-sectional view shown in FIG. 6, taken along section lines 6-6 in FIG. 5. The cross-section of the right inductor segment 204 is similar to FIG. 4. The next inductor segment (not shown in FIG. 5) in the series returns to FIG. 6, and so on. The cross-sections shown in FIGS. 4 and 6 are generally mirror images of each other, so the coil-shape of each inductor segment 204 is in an opposite spiraling angular direction from that of the inductor segments 204 on either side of it.

Thus, each two inductor segments 204 in a row are connected through only one interconnect layer 226, and the coil-shapes of each two inductor segments 204 in a row have opposite spiraling angular directions. In this configuration, the current flows through the coil-shapes of each of the inductor segments 204 in the same angular direction (as exemplified by arrows A and B in FIGS. 4 and 6, respectively). Likewise, the magnetic field created by the current flowing through each of the inductor segments 204 is oriented in the same direction (as exemplified by arrows C, D and E in FIG. 5).

The over-all inductance of the inductor 202 (FIG. 3) is generally dependent on the sum of the individual inductances of the inductor segments 204, since the inductor segments 204 are connected in series. With more inductor segments 204, the over-all inductance of the inductor 202 increases. A greater length (l) (FIG. 5) of each inductor segment 204, however, reduces the number of inductor segments 204 that can fit within the over-all length of the inductor 202, and thereby reduces the over-all inductance of the inductor 202. The greater length (l) also decreases the resistance of each conductor 234 and via 236 (FIG. 4) that form the inductor segments 204. Therefore, there is a tradeoff between higher inductance and lower resistance.

Figure 7:
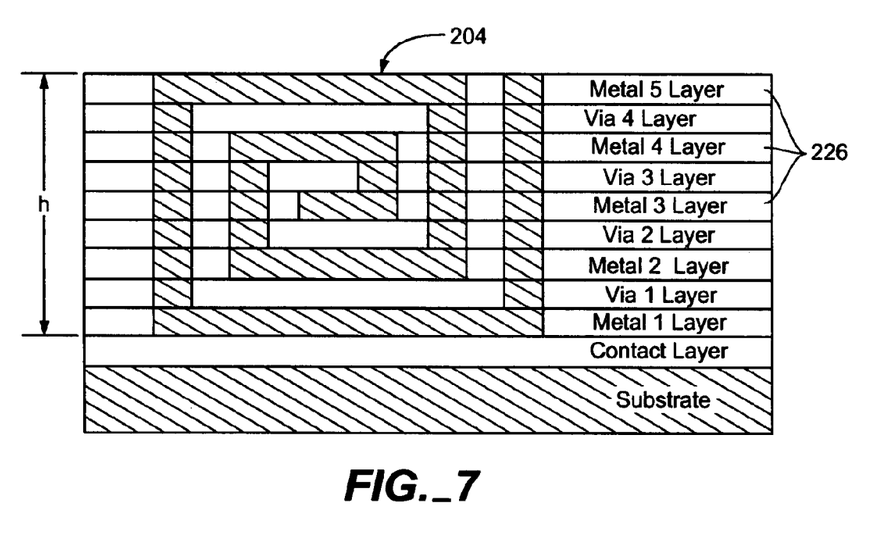
FIGS. 7, 8 and 9 are simplified, broken, cross-sectional views of alternative embodiments of portions of the integrated circuit shown in FIG. 3.
Figure 8:
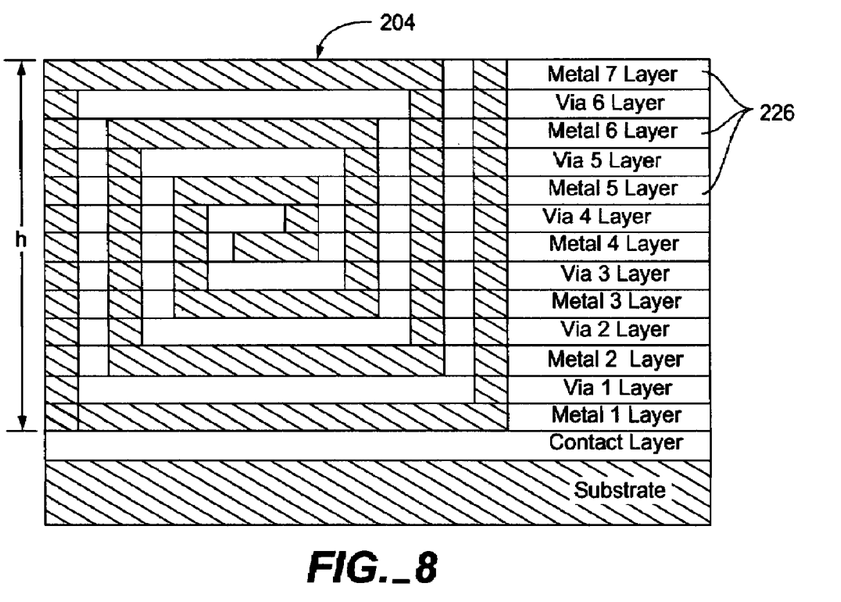
Figure 9:
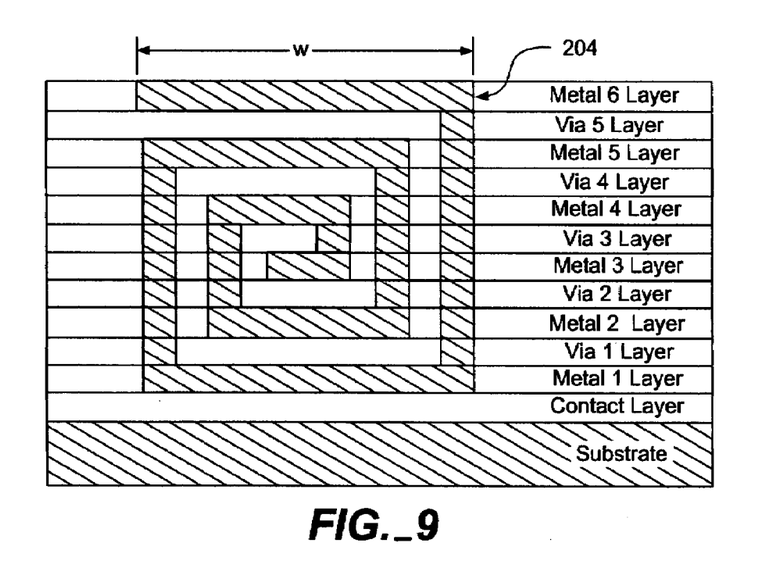

The inductance of each inductor segment 204 generally depends on, among other factors, the width (w) and height (h) dimensions (FIG. 4) of the cross-section of the inductor segment 204 and the number of turns of the coil-shape within these dimensions. The height (h) and number of turns are generally dependent on the number of interconnect layers 226 (FIGS. 4, 5 and 6) used in the IC 200. FIGS. 7 and 8, for example, show alternative embodiments with different numbers of interconnect layers 226. FIG. 7 shows only five interconnect layers 226, thereby allowing for a lower height (h) and fewer turns. FIG. 8, on the other hand, shows seven interconnect layers 226, thereby allowing for a greater height (h) and more turns. Design considerations for the height (h) and number of turns are, therefore, relatively constrained. The width (w), however, is not so constrained. Instead, the width (w) may be formed at almost any dimension to obtain the desired inductance for the inductor segments 204 and the over-all inductance of the inductor 202 (FIG. 3). FIG. 9, for example, shows an inductor segment 204 having a shorter width (w) than the inductor segments 204 shown in FIGS. 4 and 6. Larger widths (w) may be constrained only by the maximum required inductance of the inductor 202 and/or the size requirements for the IC 200 (FIG. 3).

Figure 10:
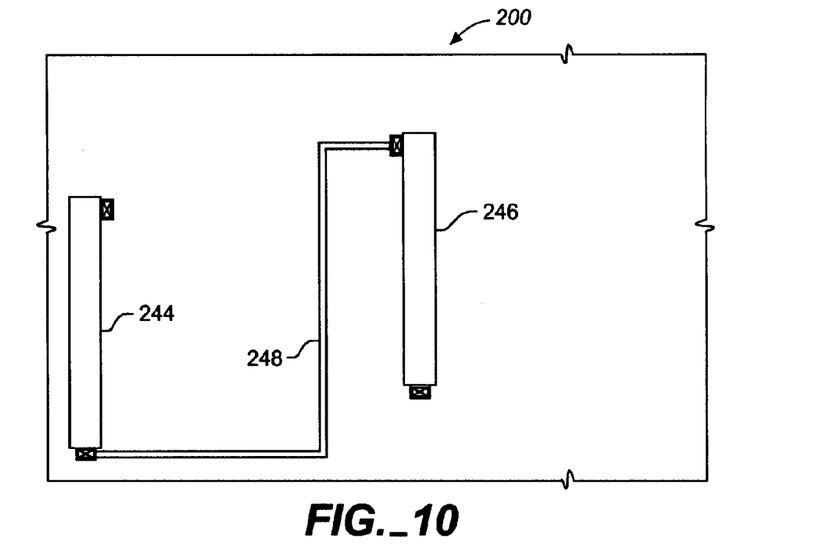
FIG. 10 is a simplified schematic of another alternative embodiment of portions of the integrated circuit shown in FIG. 3.

In an alternative embodiment, more than one inductor 244 and 246, similar to the inductor 202 (FIG. 3), is included in the IC 200, as shown in FIG. 10. The inductors 244 and 246 may be electrically connected together, preferably in series, by a conductor 248 to combine their inductances. The inductors 244 and 246 may also be offset from each other at any appropriate locations in the IC 200 and have any appropriate length, width and number of inductor segments 204 (FIGS. 3-9).

Figure 11:
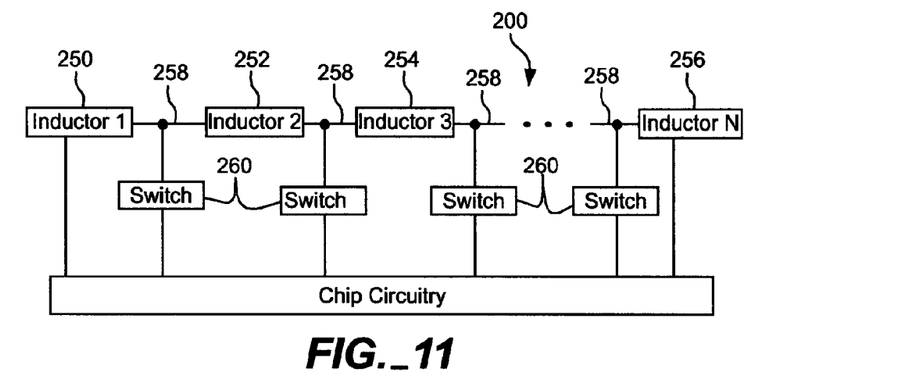
FIGS. 11 and 12 are simplified schematics of additional alternative embodiments of portions of the integrated circuit shown in FIG. 3.
Figure 12:
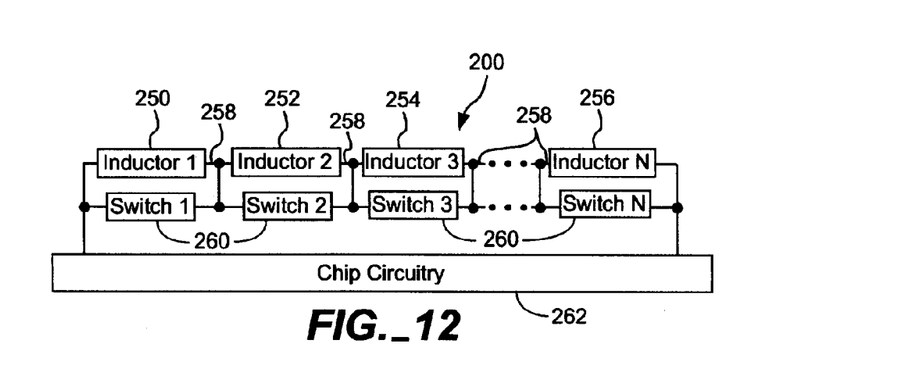

In other alternative embodiments, N inductors 250, 252, 254 and 256 (similar to the inductor 202, FIG. 3, or the inductor segments 204, FIGS. 3-9) are connected together in series by conductors 258 and with switches 260 (e.g. transistors, fuse legs, etc.) by which the over-all inductance and/or quality factor value of the combined inductors 250-256 may be set or controlled, as shown in FIGS. 11 and 12. In the embodiment shown in FIG. 11, the switches 260 electrically connect the conductors 258 between each adjacent pair of the inductors 250-256 to chip circuitry 262, which is similar to the substrate 232 (FIGS. 4-9). In this manner, all of the inductors 250-256 that occur in the series after the conductor 258 at which any selected switch is "on" are effectively short-circuited out of contributing to the over-all inductance and/or quality factor of the combined inductors 250-256. In the embodiment shown in FIG. 12, the switches 260 are each electrically connected to the conductors 258 in parallel with a corresponding one of the inductors 250-256. The first and last inductors 250 and 256 are connected to the chip circuitry 262. In this manner, the inductors 250-256 that correspond to any of the switches 260 that are "on" are effectively short-circuited out of contributing to the over-all inductance and/or quality factor of the combined inductors 250-256. In both of these embodiments, the over-all inductance of the combined inductors 250-256 can be set by selecting which of the switches 260 are to be on and which are to be off.

It is apparent from the previous description that the present invention enables the incorporation of one or more inductors into an IC with a relatively high level of flexibility in the design and relatively little adverse impact on other parts of the IC. Thus, the present invention enables less expensive IC's due to the lower required design margins for components of the IC and higher performing IC's due to the higher quality factor of the inductor. Additionally, since the inductors are formed by conventional conductors and vias in the interconnect layers and ILD layers, the fabrication of the inductors can be incorporated into existing metalization procedures without increasing the time or cost to fabricate the over-all IC. Also, since the time-dependent magnetic field of the inductor is relatively minor along the length of the inductor, other components of the IC can be placed in close proximity to the inductor and the inductor can be placed in almost any location in the IC, thereby more efficiently utilizing the available space in the IC. Furthermore, the segmentation of the inductor or the use of more than one inductor allows for control of the over-all inductance during design or operation of the IC by turning on or off selected inductors or inductor segments.

Presently preferred embodiments of the present invention and many of its improvements have been described with a degree of particularity. This description is of preferred examples of implementing the invention, and is not necessarily intended to limit the scope of the invention. The scope of the invention is defined by the following claims.

The invention claimed is:

1. A method of fabricating an integrated circuit having conductor layers separated by insulating layers arranged substantially parallel to a plane of the integrated circuit, comprising:
   forming an inductor within the conductor layers and the insulating layers by:
   forming a first segment of the inductor having a coil-shape in a first spiraling angular direction;
   forming a second segment of the inductor proximate to and spaced apart from the first segment and having a coil-shape in a second spiraling angular direction; and
   electrically connecting the first segment and the second segment;
   and wherein the inductor has magnetic flux lines substantially parallel to the plane of the integrated circuit upon operation of the integrated circuit.

2. A method of fabricating an integrated circuit having conductor layers separated by insulating layers arranged substantially parallel to a plane of the integrated circuit, the integrated circuit including other components for performing functions of the integrated circuit, comprising:
   forming an inductor within the conductor layers and the insulating layers by forming a first segment of the inductor, forming a second segment of the inductor proximate to and spaced apart from the first segment, and electrically connecting the first segment and the second segment, the inductor having magnetic flux lines substantially parallel to the plane of the integrated circuit upon operation of the integrated circuit; and
   forming conductors between the first segment and the second segment, the conductors electrically connecting the other components of the integrated circuit.

3. A method of fabricating an integrated circuit having conductor layers separated by insulating layers arranged substantially parallel to a plane of the integrated circuit, comprising:
   forming an inductor within the conductor layers and the insulating layers and having magnetic flux lines substantially parallel to the plane of the integrated circuit upon operation of the integrated circuit;
   and wherein:
   the inductor includes an end;
   the integrated circuit includes an edge; and
   the step of forming the inductor further comprises forming the inductor with the end thereof proximate to the edge of the integrated circuit.

4. A method as defined in claim 3 wherein:
   the aforementioned edge of the integrated circuit is a first edge;
   the integrated circuit includes a second edge opposite the first edge;
   the aforementioned end of the inductor is a first end;
   the inductor includes a second end opposite the first end; and
   the step of forming the inductor further comprises:
   forming the inductor with the first end thereof proximate to the first edge of the integrated circuit and the second end of the inductor proximate to the second edge of the integrated circuit.

5. A method as defined in claim 3 wherein:
   the magnetic flux lines of the inductor have a greatest density at the end of the inductor proximate to the edge of the integrated circuit upon operation of the integrated circuit.

6. A method of fabricating an integrated circuit having conductor layers separated by insulating layers arranged substantially parallel to a plane of the integrated circuit, comprising:
   forming a first inductor within the conductor layers and the insulating layers and having magnetic flux lines substantially parallel to the plane of the integrated circuit upon operation of the integrated circuit; and
   forming a second inductor within the conductor layers and the insulating layers and having magnetic flux lines substantially parallel to the plane of the integrated circuit upon operation of the integrated circuit, the second inductor being substantially similar to the first inductor and offset laterally and longitudinally from the first inductor.

7. A method of fabricating an integrated circuit having conductor layers separated by insulating layers arranged substantially parallel to a plane of the integrated circuit, comprising:
   forming a first inductor within the conductor layers and the insulating layers and having magnetic flux lines substantially parallel to the plane of the integrated circuit upon operation of the integrated circuit;
   forming a plurality of inductors similar to the first inductor, each of the inductors having an inductance;
   electrically connecting the inductors in a series in which each inductor, except a last inductor in the series, is followed by at least one inductor subsequent thereto and each inductor, except an initial inductor in the series, is preceded by at least one inductor;
   electrically connecting the inductors with a plurality of switch devices, each switch device corresponding to at least one of the inductors, each switch device turning off the corresponding inductor and any inductors subsequent to the corresponding inductor when the switch device is in a first state, each switch device turning on the corresponding inductor when the switch device and the switch devices corresponding to any inductors preceding the corresponding inductor are in a second state, each of the inductors adding to an over-all inductance of the plurality of inductors when turned on;
   selecting the over-all inductance of the plurality of inductors by selecting at least a portion of the inductors; and
   setting the over-all inductance of the plurality of inductors by having in the first state at least one switch device for which the corresponding inductor and any subsequent inductors thereof are not selected.

8. A method of fabricating an integrated circuit having conductor layers separated by insulating layers arranged substantially parallel to a plane of the integrated circuit, comprising:

forming a first inductor within the conductor layers and the insulating layers and having magnetic flux lines substantially parallel to the plane of the integrated circuit upon operation of the integrated circuit;

forming a plurality of inductors similar to the first inductor, each of the inductors having an inductance;

electrically connecting the inductors with a plurality of switch devices, each switch device corresponding to one of the inductors and turning off the corresponding inductor when in a first state and turning on the corresponding inductor when in a second state, each of the inductors adding to an over-all inductance of the plurality of inductors when turned on;

selecting the over-all inductance of the plurality of inductors by selecting at least a portion of the inductors; and setting the over-all inductance of the plurality of inductors by having in the first state any switch devices that correspond to any inductors that are not selected and having in the second state any switch devices that correspond to any inductors that are selected.

* * * * *